US008433845B2

(12) United States Patent
Borchers et al.

(10) Patent No.: US 8,433,845 B2
(45) Date of Patent: Apr. 30, 2013

(54) DATA STORAGE DEVICE WHICH SERIALIZES MEMORY DEVICE READY/BUSY SIGNALS

(75) Inventors: Albert T. Borchers, Santa Cruz, CA (US); Andrew T. Swing, Los Gatos, CA (US); Robert S. Sprinkle, San Jose, CA (US); Jason W. Klaus, Brooklyn, NY (US)

(73) Assignee: Google Inc., Mountain View, CA (US)

(*) Notice: Subject to any disclaimer, the term of this patent is extended or adjusted under 35 U.S.C. 154(b) by 485 days.

(21) Appl. No.: 12/756,009

(22) Filed: Apr. 7, 2010

(65) Prior Publication Data

US 2010/0262767 A1 Oct. 14, 2010

Related U.S. Application Data

(60) Provisional application No. 61/167,709, filed on Apr. 8, 2009, provisional application No. 61/187,835, filed on Jun. 17, 2009, provisional application No. 61/304,469, filed on Feb. 14, 2010, provisional application No. 61/304,468, filed on Feb. 14, 2010, provisional application No. 61/304,475, filed on Feb. 14, 2010.

(51) Int. Cl.
*G06F 12/00* (2006.01)

(52) U.S. Cl.
USPC .... 711/103; 711/105; 711/156; 711/E12.001; 711/E12.008

(58) Field of Classification Search ............ None
See application file for complete search history.

(56) References Cited

U.S. PATENT DOCUMENTS

| 4,449,182 | A | | 5/1984 | Rubinson et al. |
| 4,777,595 | A | | 10/1988 | Strecker et al. |
| 5,137,118 | A | * | 8/1992 | Iwata ............................ 187/316 |
| 5,535,416 | A | | 7/1996 | Feeney et al. |
| 5,619,687 | A | | 4/1997 | Langan et al. |

(Continued)

FOREIGN PATENT DOCUMENTS

| EP | 1736885 A2 | 12/2006 |
| JP | 2004-071033 | 4/2004 |

(Continued)

OTHER PUBLICATIONS

International Search Report and Written Opinion received for PCT Application No. PCT/US2010/029677, mailed on Jul. 5, 2010, 13 pages.

(Continued)

*Primary Examiner* — Kevin Verbrugge
(74) *Attorney, Agent, or Firm* — Brake Hughes Bellermann LLP

(57) ABSTRACT

A data storage device may include a command bus, a status bus, multiple memory devices that are operably coupled to the command bus and to the status bus, and a controller including multiple channel controllers, where the channel controllers are operably coupled to the command bus and to the status bus and each of the channel controllers is arranged and configured to control one or more of the memory devices. The data storage device may include multiple programmable logic devices that are operably coupled to the status bus, where each of the programmable logic devices is configured to retrieve a ready/busy signal from each of the memory devices under control of one of the channel controllers using the status bus, serialize the ready/busy signals and communicate the serialized ready/busy signals to the channel controllers.

19 Claims, 5 Drawing Sheets

U.S. PATENT DOCUMENTS

| | | |
|---|---|---|
| 5,708,814 A | 1/1998 | Short et al. |
| 5,802,345 A | 9/1998 | Matsunami et al. |
| 5,844,776 A | 12/1998 | Yamaguchi et al. |
| 6,003,112 A | 12/1999 | Tetrick |
| 6,009,478 A | 12/1999 | Panner et al. |
| 6,167,338 A | 12/2000 | De Wille et al. |
| 6,172,676 B1 | 1/2001 | Wood |
| 6,343,660 B1 | 2/2002 | Mutsaers |
| 6,640,274 B1 | 10/2003 | Huffman et al. |
| 6,640,290 B1 | 10/2003 | Forin et al. |
| 6,678,463 B1 | 1/2004 | Pierre et al. |
| 6,697,284 B2 | 2/2004 | Marotta |
| 6,757,797 B1 | 6/2004 | Kaiya et al. |
| 6,781,914 B2 | 8/2004 | Ha |
| 6,854,022 B1 | 2/2005 | Thelin |
| 6,868,007 B2 | 3/2005 | Hasegawa et al. |
| 6,901,461 B2 | 5/2005 | Bennett |
| 6,931,498 B2 | 8/2005 | Talreja et al. |
| 6,938,188 B1 | 8/2005 | Kelleher |
| 6,982,919 B2 | 1/2006 | Kumahara et al. |
| 7,000,245 B1 | 2/2006 | Pierre et al. |
| 7,012,632 B2 | 3/2006 | Freeman et al. |
| 7,024,695 B1 | 4/2006 | Kumar et al. |
| 7,028,137 B2 | 4/2006 | Nashimoto et al. |
| 7,080,245 B2 | 7/2006 | Ballard et al. |
| 7,080,377 B2 | 7/2006 | Peled et al. |
| 7,088,387 B1 | 8/2006 | Freeman et al. |
| 7,114,051 B2 | 9/2006 | Guu et al. |
| 7,127,549 B2 | 10/2006 | Sinclair |
| 7,127,551 B2 | 10/2006 | Beck |
| 7,158,167 B1 | 1/2007 | Yerazunis et al. |
| 7,159,104 B2 | 1/2007 | Dewey |
| 7,161,834 B2 | 1/2007 | Kumahara et al. |
| 7,225,289 B2 | 5/2007 | Tee et al. |
| 7,296,213 B2 | 11/2007 | Vainsencher et al. |
| 7,310,699 B2 | 12/2007 | Sinclair |
| 7,325,104 B2 | 1/2008 | Satori et al. |
| 7,328,304 B2 | 2/2008 | Royer, Jr. et al. |
| 7,356,637 B2 | 4/2008 | Tee et al. |
| 7,370,230 B1 | 5/2008 | Flake |
| 7,392,367 B2 | 6/2008 | Clark et al. |
| 7,406,572 B1 | 7/2008 | Nguyen |
| 7,546,393 B2 | 6/2009 | Day et al. |
| 7,562,366 B2 | 7/2009 | Pope et al. |
| 7,610,443 B2 | 10/2009 | Huang |
| 7,631,084 B2 | 12/2009 | Thomas et al. |
| 7,660,306 B1 | 2/2010 | Eiriksson et al. |
| 7,668,177 B1 | 2/2010 | Trapp et al. |
| 7,730,257 B2 | 6/2010 | Franklin |
| 7,836,378 B2 | 11/2010 | Shaeffer et al. |
| 7,865,809 B1 | 1/2011 | Lee et al. |
| 7,904,639 B2 | 3/2011 | Kim et al. |
| 7,934,055 B2 | 4/2011 | Flynn et al. |
| 8,037,234 B2 | 10/2011 | Yu et al. |
| 8,051,253 B2 | 11/2011 | Okin et al. |
| 8,086,936 B2 | 12/2011 | Gower et al. |
| 8,205,037 B2 | 6/2012 | Swing et al. |
| 8,239,713 B2 | 8/2012 | Borchers et al. |
| 8,239,721 B2 | 8/2012 | Pelletier et al. |
| 8,239,724 B2 | 8/2012 | Swing et al. |
| 8,239,729 B2 | 8/2012 | Borchers et al. |
| 8,244,962 B2 | 8/2012 | Swing et al. |
| 8,250,271 B2 | 8/2012 | Swing et al. |
| 8,327,220 B2 | 12/2012 | Borchers et al. |
| 2001/0023472 A1 | 9/2001 | Kubushiro et al. |
| 2002/0005895 A1 | 1/2002 | Freeman et al. |
| 2002/0053004 A1 | 5/2002 | Pong |
| 2002/0078285 A1 | 6/2002 | Hofstee et al. |
| 2002/0144066 A1 | 10/2002 | Talreja et al. |
| 2002/0178307 A1 | 11/2002 | Pua et al. |
| 2003/0039140 A1 | 2/2003 | Ha |
| 2003/0058689 A1 | 3/2003 | Marotta |
| 2003/0101327 A1 | 5/2003 | Beck |
| 2003/0117846 A1 | 6/2003 | Hasegawa et al. |
| 2003/0208771 A1 | 11/2003 | Hensgen et al. |
| 2003/0221092 A1 | 11/2003 | Ballard et al. |
| 2003/0225960 A1 | 12/2003 | Guu et al. |
| 2004/0049649 A1 | 3/2004 | Durrant |
| 2004/0078729 A1 | 4/2004 | Peter |
| 2004/0236933 A1 | 11/2004 | Dewey |
| 2005/0041509 A1 | 2/2005 | Kumahara et al. |
| 2005/0160218 A1 | 7/2005 | See et al. |
| 2005/0172067 A1 | 8/2005 | Sinclair |
| 2005/0172087 A1 | 8/2005 | Klingman |
| 2005/0177698 A1 | 8/2005 | Ku et al. |
| 2005/0193164 A1 | 9/2005 | Royer et al. |
| 2006/0053308 A1 | 3/2006 | Zimmerman |
| 2006/0062052 A1 | 3/2006 | Kumahara et al. |
| 2006/0123284 A1 | 6/2006 | Hwang et al. |
| 2006/0184758 A1 | 8/2006 | Satori et al. |
| 2006/0206653 A1 | 9/2006 | Tee et al. |
| 2007/0008801 A1 | 1/2007 | Chiang et al. |
| 2007/0028040 A1 | 2/2007 | Sinclair |
| 2007/0101238 A1 | 5/2007 | Resnick et al. |
| 2007/0113150 A1 | 5/2007 | Resnick et al. |
| 2007/0174509 A1 | 7/2007 | Day et al. |
| 2007/0198796 A1 | 8/2007 | Warren, Jr. |
| 2007/0208900 A1 | 9/2007 | Tee et al. |
| 2007/0255890 A1 | 11/2007 | Urata et al. |
| 2007/0255981 A1 | 11/2007 | Eto et al. |
| 2007/0288686 A1 | 12/2007 | Arcedera et al. |
| 2007/0288692 A1 | 12/2007 | Bruce et al. |
| 2008/0010431 A1 | 1/2008 | Chang et al. |
| 2008/0022186 A1 | 1/2008 | Co et al. |
| 2008/0040531 A1 | 2/2008 | Anderson |
| 2008/0052448 A1 | 2/2008 | Minz et al. |
| 2008/0052449 A1 | 2/2008 | Kim et al. |
| 2008/0052451 A1 | 2/2008 | Pua et al. |
| 2008/0059747 A1 | 3/2008 | Burckart et al. |
| 2008/0065815 A1 | 3/2008 | Nasu et al. |
| 2008/0077727 A1 | 3/2008 | Baca et al. |
| 2008/0091915 A1 | 4/2008 | Moertl et al. |
| 2008/0126658 A1 | 5/2008 | Wang |
| 2008/0147931 A1 | 6/2008 | McDaniel et al. |
| 2008/0155160 A1 | 6/2008 | McDaniel |
| 2008/0163030 A1 | 7/2008 | Lee |
| 2008/0178025 A1 | 7/2008 | Hand et al. |
| 2008/0209157 A1 | 8/2008 | Weng |
| 2008/0222491 A1 | 9/2008 | Lee et al. |
| 2008/0235467 A1 | 9/2008 | Tagawa |
| 2008/0288814 A1 | 11/2008 | Kitahara |
| 2008/0294814 A1 | 11/2008 | Gorobets |
| 2008/0301349 A1 | 12/2008 | Bacha |
| 2008/0301381 A1 | 12/2008 | Lee et al. |
| 2008/0320214 A1 | 12/2008 | Ma et al. |
| 2009/0006720 A1 | 1/2009 | Traister |
| 2009/0037652 A1 | 2/2009 | Yu et al. |
| 2009/0044078 A1 | 2/2009 | Vogan et al. |
| 2009/0055590 A1 | 2/2009 | Takahashi |
| 2009/0063895 A1 | 3/2009 | Smith |
| 2009/0063922 A1 | 3/2009 | Gower et al. |
| 2009/0063934 A1 | 3/2009 | Jo |
| 2009/0119443 A1 | 5/2009 | Tremaine |
| 2009/0125785 A1 | 5/2009 | Gorobets et al. |
| 2009/0125790 A1 | 5/2009 | Iyer et al. |
| 2009/0164698 A1 | 6/2009 | Ji et al. |
| 2009/0240873 A1 | 9/2009 | Yu et al. |
| 2009/0265513 A1 | 10/2009 | Ryu |
| 2010/0049914 A1 | 2/2010 | Goodwin |
| 2010/0153660 A1 | 6/2010 | Lasser et al. |
| 2010/0211737 A1 | 8/2010 | Flynn et al. |
| 2010/0262738 A1 | 10/2010 | Swing et al. |
| 2010/0262740 A1 | 10/2010 | Borchers et al. |
| 2010/0262757 A1 | 10/2010 | Sprinkle et al. |
| 2010/0262758 A1 | 10/2010 | Swing et al. |
| 2010/0262759 A1 | 10/2010 | Borchers et al. |
| 2010/0262760 A1 | 10/2010 | Swing et al. |
| 2010/0262761 A1 | 10/2010 | Borchers et al. |
| 2010/0262762 A1 | 10/2010 | Borchers et al. |
| 2010/0262766 A1 | 10/2010 | Sprinkle et al. |
| 2010/0262773 A1 | 10/2010 | Borchers et al. |
| 2010/0262894 A1 | 10/2010 | Swing et al. |
| 2010/0262979 A1 | 10/2010 | Borchers et al. |
| 2010/0269015 A1 | 10/2010 | Borchers et al. |
| 2010/0287217 A1 | 11/2010 | Borchers et al. |
| 2011/0191554 A1 | 8/2011 | Sakai |
| 2011/0213921 A1 | 9/2011 | Yu et al. |

| | | | |
|---|---|---|---|
| 2011/0238885 | A1 | 9/2011 | Kitahara et al. |
| 2012/0030416 | A1 | 2/2012 | Borchers et al. |
| 2012/0030507 | A1 | 2/2012 | Borchers et al. |
| 2012/0030542 | A1 | 2/2012 | Borchers et al. |

FOREIGN PATENT DOCUMENTS

| | | | |
|---|---|---|---|
| WO | 01/33852 | A1 | 5/2001 |
| WO | 01/90900 | A1 | 11/2001 |
| WO | 02/003388 | A2 | 1/2002 |
| WO | 02/11424 | A2 | 2/2002 |
| WO | 02/058383 | A1 | 7/2002 |
| WO | 2005/081097 | A2 | 9/2005 |
| WO | 2005/093588 | A2 | 10/2005 |
| WO | 2005/081097 | A3 | 11/2005 |
| WO | 2005/093588 | A3 | 12/2006 |
| WO | 2007/072313 | A2 | 6/2007 |
| WO | 2007/072317 | A2 | 6/2007 |
| WO | 2007/072317 | A3 | 6/2007 |
| WO | 2007/096844 | A2 | 8/2007 |
| WO | 2007/096884 | A3 | 8/2007 |
| WO | 2007/146756 | A2 | 12/2007 |
| WO | 2007/146845 | A2 | 12/2007 |
| WO | 2008/022094 | A2 | 2/2008 |
| WO | 2008/040028 | A2 | 4/2008 |
| WO | 2008/025238 | A1 | 6/2008 |
| WO | 2008/147752 | A1 | 12/2008 |
| WO | 2010/117877 | A1 | 10/2010 |
| WO | 2010/117878 | A1 | 10/2010 |

OTHER PUBLICATIONS

International Search Report and Written Opinion received for PCT Application No. PCT/US2010/029679, mailed on Jul. 5, 2010, 20 pages.
International Search Report and Written Opinion received for PCT Application No. PCT/US2010/029916, mailed on Jul. 7, 2010, 14 pages.
International Search Report and Written Opinion received for PCT Application No. PCT/US2010/029917, mailed on Jul. 28, 2010, 19 pages.
International Search Report and Written Opinion received for PCT Application No. PCT/US2010/029919, mailed on Jul. 28, 2010, 11 pages.
International Search Report and Written Opinion received for PCT Application No. PCT/US2010/030389, mailed on Jul. 21, 2010, 11 pages.
U.S. Appl. No. 12/537,733, filed Aug. 7, 2009.
U.S. Appl. No. 12/537,727, filed Aug. 7, 2009.
U.S. Appl. No. 12/537,725, filed Aug. 7, 2009.
U.S. Appl. No. 12/537,722, filed Aug. 7, 2009.
U.S. Appl. No. 12/537,719, filed Aug. 7, 2009.
U.S. Appl. No. 12/537,709, filed Aug. 7, 2009.
U.S. Appl. No. 12/755,968, filed Apr. 7, 2010, 41 pages.
U.S. Appl. No. 12/755,964, filed Apr. 7, 2010, 44 pages.
U.S. Appl. No. 12/537,748, filed Aug. 7, 2009.
U.S. Appl. No. 12/537,738, filed Aug. 7, 2009.
U.S. Appl. No. 12/756,007, filed Apr. 7, 2010, 54 pages.
U.S. Appl. No. 12/756,477, filed Apr. 8, 2010, 51 pages.
Non Final Office Action for U.S. Appl. No. 12/537,727, mailed on Dec. 13, 2010, 20 pages.
Non-Final Office Action for U.S. Appl. No. 12/755,968, mailed Jan. 26, 2012, 32 pages.
Non-Final Office Action Response for U.S. Appl. No. 12/537,727, filed Mar. 8, 2012, 22 pages.
Non-Final Office Action for U.S. Appl. No. 12/537,709, mailed Dec. 19, 2011, 28 pages.
Non-Final Office Action for U.S. Appl. No. 12/537,719, mailed Nov. 30, 2011, 29 pages.
Non-Final Office Action for U.S. Appl. No. 12/537,722, mailed Dec. 19, 2011, 25 pages.
Non-Final Office Action for U.S. Appl. No. 12/537,704, mailed Nov. 28, 2011, 24 pages.
Non-Final Office Action for U.S. Appl. No. 12/537,748, mailed Dec. 12, 2011, 24 pages.
Non-Final Office Action for U.S. Appl. No. 12/537,741, mailed Dec. 21, 2011, 25 pages.
Non-Final Office Action for U.S. Appl. No. 12/537,738, mailed Dec. 12, 2011, 25 pages.
Non-Final Office Action for U.S. Appl. No. 12/537,725, mailed Jan. 30, 2012, 33 pages.
Non-Final Office Action for U.S. Appl. No. 12/537,733, mailed Mar. 14, 2012, 23 pages.
Non-Final Office Action Response for U.S. Appl. No. 12/537,704, filed Feb. 28, 2012, 25 pages.
Non-Final Office Action Response for U.S. Appl. No. 12/537,709, filed Mar. 19, 2012, 25 pages.
Wen, et al "A Processor-DMA-Based Memory Copy Hardware Accelerator", 2011 Sixth IEEE International Conference on Networking, Arcitecture and Storage, Jul. 30, 2011, pp. 225-229.
Non-Final Office Action for U.S. Appl. No. 12/537,727, mailed Nov. 8, 2011, 13 pages.
Non-Final Office Action Response for U.S. Appl. No. 12/537,719, filed Feb. 29, 2012, 23 pages.
Non-Final Office Action Response for U.S. Appl. No. 12/537,727, filed Aug. 31, 2011, 15 pages.
Non-Final Office Action Response for U.S. Appl. No. 13/269,183, filed Mar. 27, 2012, 19 pages.
Non-Final Office Action for U.S. Appl. No. 13/269,183, mailed Dec. 27, 2011, 27 pages.
Non-Final Office Action for U.S. Appl. No. 13/269,972, mailed Jan. 5, 2012, 26 pages.
Paris, "Evaluating the Impact of Irrecoverable Read Errors on Disk Array Reliability", 15th IEEE Pacific Rim International Symposium on Dependable Computing, Nov. 16-18, 2009, 6 pages.
Takeuchi, "Novel Co-Design of NAND Flash Memory and NAND Flash Controller Circuits for Sub-30 nm Low-Power High-Speed Solid-State Drivers (SS)", IEEE Journal of Solid-State Circuits, vol. 44, No. 4, Apr. 2009, pp. 1227-1234.
Non-Final Office Action for U.S. Appl. No. 13/269,985, mailed Jan. 6, 2012, 24 pages.
Non-Final Office Action Response for U.S. Appl. No. 13/269,985, filed Apr. 4, 2012, 25 pages.
Non-Final Office Action Response for U.S. Appl. No. 13/269,972, filed Apr. 4, 2012, 25 pages.
Non-Final Office Action Response for U.S. Appl. No. 13/269,183, filed Mar. 27, 2012, 17 pages.
Notice of Allowance for U.S. Appl. No. 13/269,183, mailed Apr. 19, 2012, 15 pages.
Notice of Allowance for U.S. Appl. No. 12/537,727, mailed Apr. 24, 2012, 14 pages.
Final Office Action for U.S. Appl. No. 12/537,719, mailed Apr. 9, 2012, 21 pages.
Notice of Allowance for U.S. Appl. No. 12/537,709, mailed Apr. 6, 2012, 14 pages.
Final Office Action for U.S. Appl. No. 12/537,704, mailed Apr. 6, 2012, 15 pages.
Non-Final Office Action for U.S. Appl. No. 12/537,727, mailed on Jun. 3, 2011, 15 pages.
Non-Final Office Action Response for U.S. Appl. No. 12/537,727, filed Mar. 14, 2011, 11 pages.
Office Action Response and RCE for U.S. Appl. No. 12/537,733, filed Oct. 9, 2012, 12 pages.
Notice of Allowance for U.S. Appl. No. 12/537,733, mailed Nov. 27, 2012, 11 pages.
Final Office Action Response and RCE for U.S. Appl. No. 12/537,741, filed Oct. 4, 2012, 17 pages.
Final Office Action Response for U.S. Appl. No. 12/537,748, filed Oct. 4, 2012, 16 pages.
Notice of Allowance for U.S. Appl. No. 13/269,985, mailed Oct. 16, 2012, 16 pages.
Ex Parte Quayle Action for U.S. Appl. No. 12/755,964, mailed Sep. 10, 2012, 31 pages.
"Information technology—AT Attachment 8—ATA/ATAPI Command Set (ATA8-ACS)", Working Draft Project American National Standard, T13/1699-D, Revision 4a, May 21, 2007, 462 pages.
Patent Examination Report No. 1 for Australian Application No. 2010234772, mailed Oct. 31, 2012, 3 pages.

Patent Examination Report No. 1 for Australian Application No. 2010234773, mailed Oct. 31, 2012, 4 pages.
Final Office Action Response for U.S. Appl. No. 12/537,719, filed Jul. 9, 2012, 14 pages.
Final Office Action for U.S. Appl. No. 12/537,733, mailed Jul. 9, 2012, 22 pages.
Non-Final Office Action Response for U.S. Appl. No. 12/537,733, filed Jun. 14, 2012, 10 pages.
Final Office Action for U.S. Appl. No. 12/537,741, mailed Jul. 6, 2012, 22 pages.
Final Office Action for U.S. Appl. No. 12/537,748, mailed Jul. 9, 2012, 22 pages.
Non-Final Office Action for U.S. Appl. No. 12/756,477, mailed Jul. 19, 2012, 38 pages.
Non-Final Office Action Response for U.S. Appl. No. 12/537,704, filed Jul. 5, 2012, 16 pages.
Notice of Allowance for U.S. Appl. No. 12/537,722, mailed May 11, 2012, 14 pages.
Non-Final Office Action Response for U.S. Appl. No. 12/537,722, filed Apr. 19, 2012, 12 pages.
Notice of Allowance for U.S. Appl. No. 12/537,725, mailed May 21, 2012, 18 pages.
Non-Final Office Action Response for U.S. Appl. No. 12/537,725, filed Apr. 27, 2012, 12 pages.
Non-Final Office Action Response for U.S. Appl. No. 12/537,748, filed May 2, 2012, 13 pages.
Notice of Allowance for U.S. Appl. No. 13/269,972, mailed May 23, 2012, 18 pages.
Non-Final Office Action for U.S. Appl. No. 13/269,985, mailed Jun. 6, 2012, 19 pages.
Non-Final Office Action Response for U.S. Appl. No. 13/269,985, filed Sep. 6, 2012, 10 pages.

* cited by examiner

DATA STORAGE DEVICE WHICH SERIALIZES MEMORY DEVICE READY/BUSY SIGNALS

CROSS REFERENCE TO RELATED APPLICATIONS

This application claims the benefit of U.S. Provisional Application No. 61/167,709, filed Apr. 8, 2009, and titled "Data Storage Device", U.S. Provisional Application No. 61/187,835, filed Jun. 17, 2009, and titled "Partitioning and Striping in a Flash Memory Data Storage Device," U.S. Provisional Application No. 61/304,469, filed Feb. 14, 2010, and titled "Data Storage Device," U.S. Provisional Patent Application No. 61/304,468, filed Feb. 14, 2010, and titled "Data Storage Device," and U.S. Provisional Patent Application No. 61/304,475, filed Feb. 14, 2010, and titled "Data Storage Device," all of which are hereby incorporated by reference in entirety.

TECHNICAL FIELD

This description relates to a data storage device and managing the status of multiple memory chips on the data storage device.

BACKGROUND

Data storage devices may be used to store data. A data storage device may be used with a computing device to provide for the data storage needs of the computing device. In certain instances, it may be desirable to store large amounts of data on a data storage device. Also, it may be desirable to execute commands quickly to read data and to write data to the data storage device.

The throughput of the command execution on the data storage device may be related to the number of commands that may be processed by the data storage device. It may be desirable to achieve a high throughput for the data storage device by increasing the number of commands that may be processed by the data storage device.

Furthermore, it may be desirable to execute commands received from a host on the data storage device while minimizing the processing impact and overhead on the host and the data storage device.

SUMMARY

This document describes a data storage device that includes multiple memory devices divided into multiple channels and a controller having multiple channel controllers. The channel controllers and the memory devices are operably coupled to a command bus and to a status bus. Programmable logic devices (PLDs) may be operably coupled to the status bus and may be configured to retrieve a ready/busy signal from each of the memory devices using the status bus, serialize the ready/busy signals and communicate the serialized ready/busy signals to the channel controllers. In this manner, the status of each of the memory devices is known without having to poll the memory devices over the command bus. The bandwidth of the command bus does not need to be utilized to poll the status of multiple memory devices, which use the command bus to receive and to communicate commands and command-related information.

This document also describes a data storage device that includes one or more memory boards, where each of the memory boards includes multiple memory chips. The data storage device includes a controller board to which the memory boards operably connect. The data storage device may be configured to communicate with a host using an interface to receive commands from the host and to process those commands using the memory chips. For example, the host may send and the controller board may receive commands to read, write, copy and erase blocks of data using the memory chips. Throughout this document memory chips and memory devices are used interchangeably to means the same thing.

In one exemplary implementation, the controller includes a field-programmable gate array (FPGA) controller and the interface between the host and the controller board may be a high speed interface such as, for example, a peripheral component interconnect express (PCIe) interface. In this manner, the data storage device may include high storage volumes and may be configured to achieve high performance and high speeds of data transfer between the host and the memory chips.

In one exemplary implementation, the data storage device may be configured with two memory boards with each of the memory boards including multiple memory chips. The data storage device, including the controller board and two memory boards, may be configured in a disk drive form such that the data storage device fits in an on-board drive slot of a computing device. For instance, the data storage device may be configured to fit in an on-board drive slot of a server to provide data storage capacity for the server. The data storage device may be configured to be removable such that it may be removed easily from the computing device and inserted in the on-board drive slot of a different computing device. In one exemplary implementation, the data storage device may include multiple channel controllers that are arranged and configured to control operations associated with one or more memory chips.

In one exemplary implementation, the memory chips may include flash memory chips. In other exemplary implementations, each of the memory boards may include memory devices other than flash memory chips. For example, each of the memory boards may include multiple dynamic random access memory (DRAM) chips. In other exemplary implementations, the memory boards may include other types of memory devices including, for example, phase change memory (PCM) chips and other types of memory devices.

In another exemplary implementation, the controller on the controller board may be configured to recognize and to operate with one type of memory device on the one memory board and, at the same time, operate with a different type of memory device on the other memory board. For example, one of the memory boards may include flash memory chips and another memory board may include DRAM chips.

According to one general aspect, a data storage device includes a command bus, a status bus, multiple memory devices that are operably coupled to the command bus and to the status bus, a controller including multiple channel controllers, where the channel controllers are operably coupled to the command bus and to the status bus and each of the channel controllers is arranged and configured to control one or more of the memory devices. The data storage device includes multiple programmable logic devices that are operably coupled to the status bus, where each of the programmable logic devices is configured to retrieve a ready/busy signal from each of the memory devices under control of one of the channel controllers using the status bus, serialize the ready/busy signals and communicate the serialized ready/busy signals to the channel controllers.

Implementations may include one or more of the following features. For example, the memory devices may include flash memory chips. The memory devices may include dynamic random access memory (DRAM) chips. Each of the channel controllers may be configured to de-serialize the read/busy signals received from the programmable logic devices controlled by the channel controller. Each of the channel controllers may receive a status of the controlled memory devices without polling the status of the controlled memory devices over the command bus. The status bus may include an out-of-band bus that is configured to facilitate communication of a status of the memory devices to the channel controllers.

The data storage device may further include a memory board, where the memory devices are affixed to the memory board, and a controller board that is separate from the memory board and that is operably connected to the memory board, where the controller is affixed to the controller board. The programmable logic devices may be affixed to the memory board.

In another general aspect, a method for determining a status of multiple memory devices may include retrieving, by a programmable logic device, a ready/busy signal from each of multiple memory devices, serializing the retrieved ready/busy signals and communicating the serialized ready/busy signals from the programmable logic device to a channel controller.

Implementations may include one or more of the following features. The multiple memory devices may include flash memory chips. The multiple memory devices may include dynamic random access memory (DRAM) chips. The ready/busy signal may be retrieved from each of the memory devices using an out-of-band status bus. The programmable logic device may retrieve a ready/busy signal from each of a first group of memory devices controlled by a first channel controller and retrieve a ready/busy signal from each of a second group of memory devices controlled by a second channel controller. The retrieved ready/busy signals from the first group of memory devices and the second group of memory devices may be serialized and the serialized ready/busy signals may be communicated from the programmable logic device to the first channel controller and the second channel controller.

In another general aspect, a programmable logic device includes instructions that are tangibly embodied on the programmable logic device, where the instructions that, when executed, cause the programmable logic device to retrieve a ready/busy signal from each of multiple memory devices, serialize the retrieved ready/busy signals and communicate the serialized ready/busy signals to a channel controller.

Implementations may include one or more of the following features. For example, the memory devices may include flash memory chips. The memory devices may include dynamic random access memory (DRAM) chips.

The instructions that, when executed, cause the programmable logic device to retrieve the ready/busy signal may include instructions that, when executed, cause the programmable logic device to retrieve the ready/busy signal from each of the memory devices using an out-of-band status bus. The programmable logic device may be on a memory board and the channel controller may be on a separate controller board.

The instructions that, when executed, cause the programmable logic device to communicate the serialized ready/busy signals may include instructions that, when executed, cause the programmable logic device to communicate the serialized ready/busy signals to the channel controller without being polled by the channel controller.

The details of one or more implementations are set forth in the accompanying drawings and the description below. Other features will be apparent from the description and drawings, and from the claims.

BRIEF DESCRIPTION OF THE DRAWINGS

Like reference numerals may refer to the same component throughout the figures.

DETAILED DESCRIPTION

This document describes an apparatus, system(s) and techniques for data storage. Such a data storage apparatus may include a controller board having a controller that may be used with one or more different memory boards, with each of the memory boards having multiple memory devices. The memory devices may include flash memory chips, DRAM chips, PCM chips and other type of memory chips. The data storage apparatus may communicate with a host using an interface on the controller board. In this manner, the controller on the controller board may be configured to receive commands from the host using the interface and to execute those commands using the flash memory chips on the memory boards.

This document also describes programmable logic devices (PLDs), which may be on the controller board, may be used to determine a status of the memory devices. For example, the memory devices may use a ready/busy signal to indicate whether or not the device is available to accept a command for processing or not available to accept a command for processing. The PLDs may sample and retrieve the ready/busy signal from multiple memory devices, serialize the signals and communicate the information in a serialized format to a channel controller associated with those particular memory devices. In one exemplary implementation, a single PLD may serialize the ready/busy signals for multiple channel controllers. The channel controllers may be configured to de-serialize the ready/busy signal information received from the PLD and to use the information to know the status of the memory devices it controls.

Figure 1:
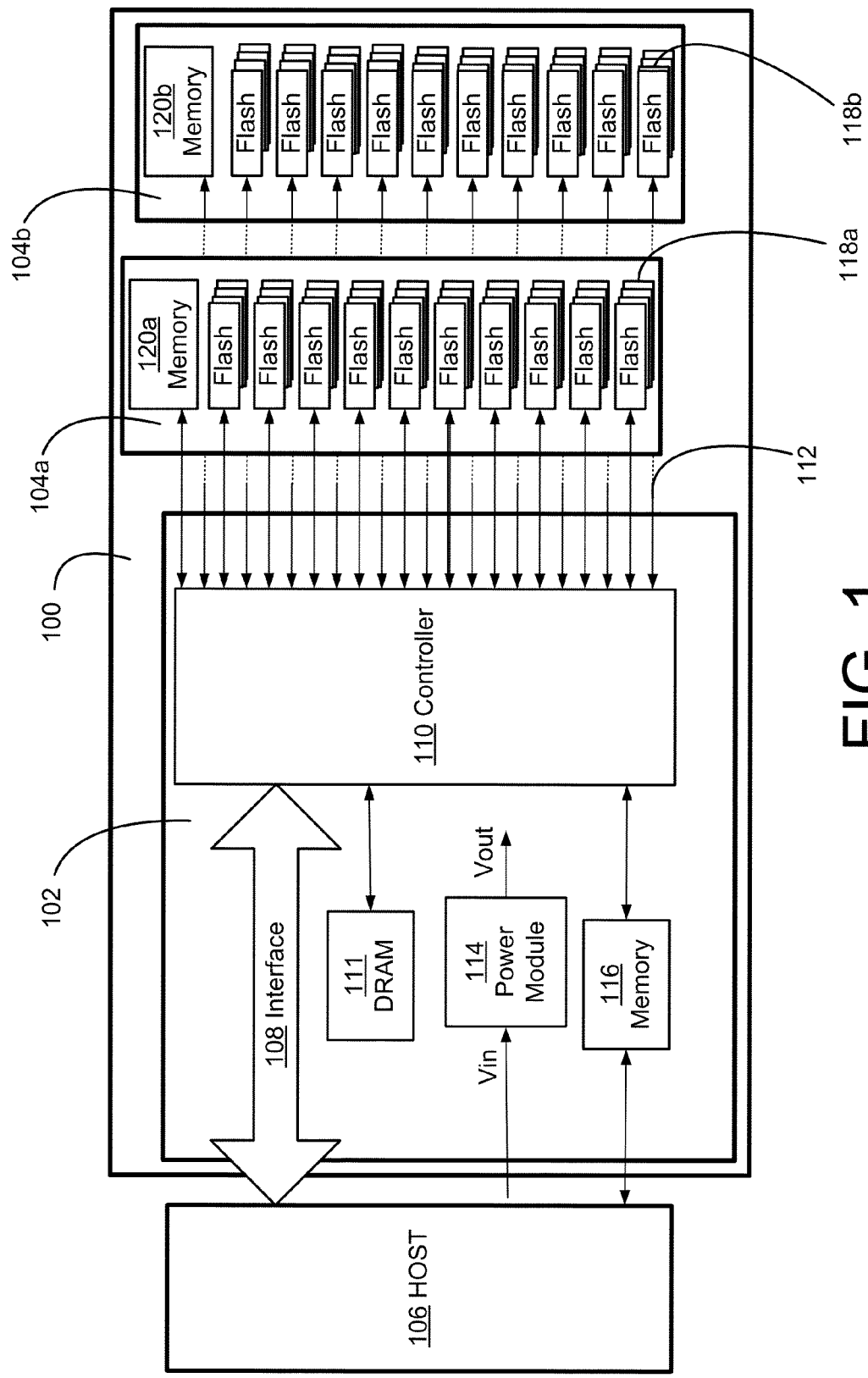
FIG. 1 is an exemplary block diagram of a data storage device.

FIG. 1 is a block diagram of a data storage device 100. The data storage device 100 may include a controller board 102 and one or more memory boards 104a and 104b. The data storage device 100 may communicate with a host 106 over an interface 108. The interface 108 may be between the host 106 and the controller board 102. The controller board 102 may include a controller 110, a DRAM 111, multiple channels 112, a power module 114, and a memory module 116. The memory boards 104a and 104b may include multiple memory devices on each of the memory boards. In this exemplary figure, multiple flash memory chips 118a and 118b are illustrated on each of the memory boards; however, as discussed above, other types of memory chips may be used including, for example, DRAM chips, PCM chips and other types of memory chips. The memory boards 104a and 104b also may include a memory device 120a and 120b.

In general, the data storage device 100 may be configured to store data on the flash memory chips 118a and 118b. The host 106 may write data to and read data from the flash memory chips 118a and 118b, as well as cause other operations to be performed with respect to the flash memory chips 118a and 118b. The reading and writing of data between the host 106 and the flash memory chips 118a and 118b, as well as the other operations, may be processed through and controlled by the controller 110 on the controller board 102. The controller 110 may receive commands from the host 106 and cause those commands to be executed using the flash memory chips 118a and 118b on the memory boards 104a and 104b. The communication between the host 106 and the controller 110 may be through the interface 108. The controller 110 may communicate with the flash memory chips 118a and 118b using the channels 112.

The controller board 102 may include DRAM 111. The DRAM 111 may be operably coupled to the controller 110 and may be used to store information. For example, the DRAM 111 may be used to store logical address to physical address maps and bad block information. The DRAM 111 also may be configured to function as a buffer between the host 106 and the flash memory chips 118a and 118b.

In one exemplary implementation, the controller board 102 and each of the memory boards 104a and 104b are physically separate printed circuit boards (PCBs). The memory board 104a may be on one PCB that is operably connected to the controller board 102 PCB. For example, the memory board 104a may be physically and/or electrically connected to the controller board 102. Similarly, the memory board 104b may be a separate PCB from the memory board 104a and may be operably connected to the controller board 102 PCB. For example, the memory board 104b may be physically and/or electrically connected to the controller board 102.

The memory boards 104a and 104b each may be separately disconnected and removable from the controller board 102. For example, the memory board 104a may be disconnected from the controller board 102 and replaced with another memory board (not shown), where the other memory board is operably connected to controller board 102. In this example, either or both of the memory boards 104a and 104b may be swapped out with other memory boards such that the other memory boards may operate with the same controller board 102 and controller 110.

In one exemplary implementation, the controller board 102 and each of the memory boards 104a and 104b may be physically connected in a disk drive form factor. The disk drive form factor may include different sizes such as, for example, a 3.5" disk drive form factor and a 2.5" disk drive form factor.

In one exemplary implementation, the controller board 102 and each of the memory board 104a and 104b may be electrically connected using a high density ball grid array (BGA) connector. Other variants of BGA connectors may be used including, for example, a fine ball grid array (FBGA) connector, an ultra fine ball grid array (UBGA) connector and a micro ball grid array (MBGA) connector. Other types of electrical connection means also may be used.

Figure 2:
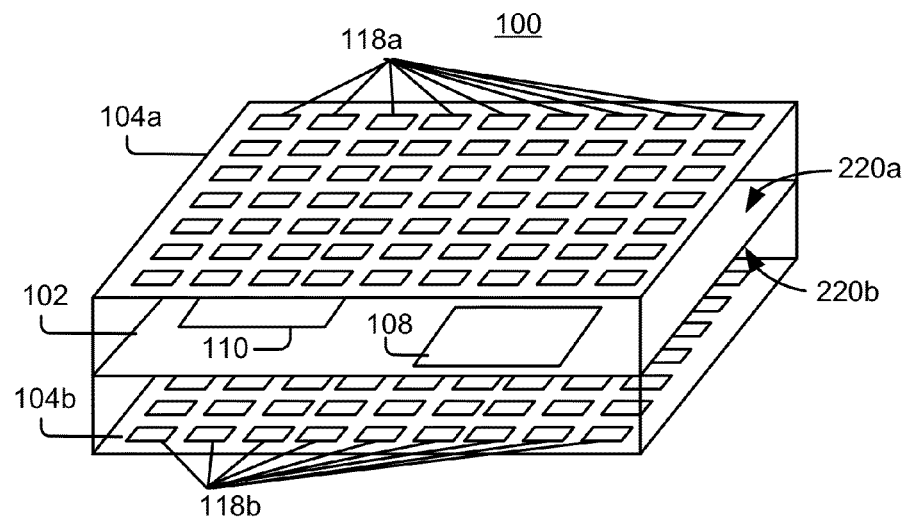
FIG. 2 is an exemplary perspective block diagram of the printed circuit boards of the data storage device.

In one exemplary implementation, the controller board 102, which is its own PCB, may be located physically between each of the memory boards 104a and 104b, which are on their own separate PCBs. Referring also to FIG. 2, the data storage device 100 may include the memory board 104a on one PCB, the controller board 102 on a second PCB, and the memory board 104b on a third PCB. The memory board 104a includes multiple flash memory chips 118a and the memory board 104b includes multiple flash memory chips 118b. The controller board 102 includes the controller 110 and the interface 108 to the host (not shown), as well as other components (not shown).

In the example illustrated by FIG. 2, the memory board 104a may be operably connected to the controller board 102 and located on one side 220a of the controller board 102. For instance, the memory board 104a may be connected to a top side 220a of the controller board 102. The memory board 104b may be operably connected to the controller board 102 and located on a second side 220b of the controller board 102. For instance, the memory board 104b may be connected to a bottom side 220b of the controller board 102.

Other physical and/or electrical connection arrangements between the memory boards 104a and 104b and the controller board 102 are possible. FIG. 2 merely illustrates one exemplary arrangement. For example, the data storage device 100 may include more than two memory board such as three memory boards, four memory boards or more memory boards, where all of the memory boards are connected to a single controller board. In this manner, the data storage device may still be configured in a disk drive form factor. Also, the memory boards may be connected to the controller board in other arrangements such as, for instance, the controller board on the top and the memory cards on the bottom or the controller board on the bottom and the memory cards on the top.

Figure 3:
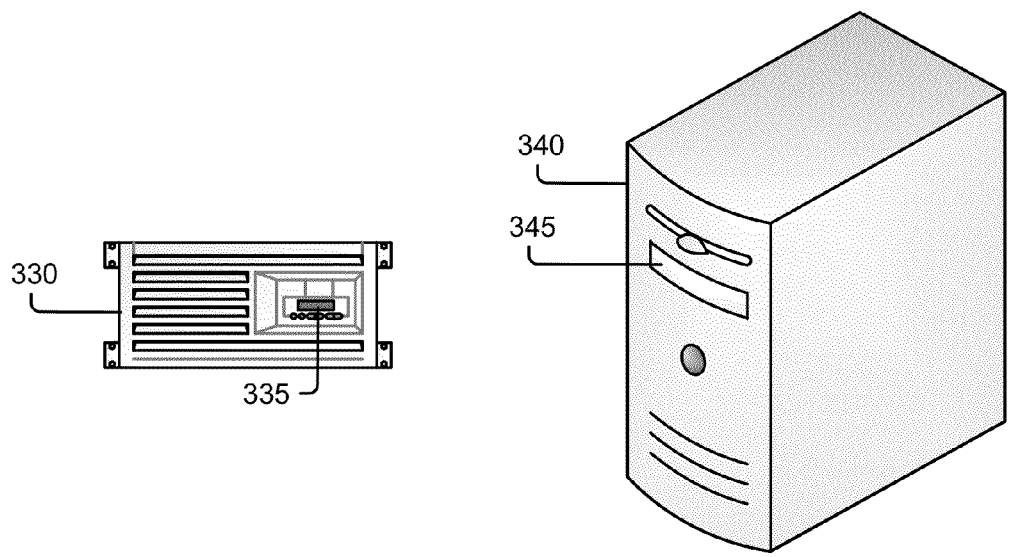
FIG. 3 is an exemplary block diagram of exemplary computing devices for use with the data storage device of FIG. 1.

The data storage device 100 may be arranged and configured to cooperate with a computing device. In one exemplary implementation, the controller board 102 and the memory boards 104a and 104b may be arranged and configured to fit within a drive bay of a computing device. Referring to FIG. 3, two exemplary computing devices are illustrated, namely a server 330 and a server 340. The servers 330 and 340 may be arranged and configured to provide various different types of computing services. The servers 330 and 340 may include a host (e.g., host 106 of FIG. 1) that includes computer program products having instructions that cause one or more processors in the servers 330 and 340 to provide computing services. The type of server may be dependent on one or more application programs that are operating on the server. For instance, the servers 330 and 340 may be application servers, web servers, email servers, search servers, streaming media servers, e-commerce servers, file transfer protocol (FTP) servers, other types of servers or combinations of these servers. The server 330 may be configured to be a rack-mounted server that operates within a server rack. The server 340 may be configured to be a stand-alone server that operates independent of a server rack. Even though the server 340 is not within a server rack, it may be configured to operate with other servers and may be operably connected to other servers. Servers 330 and 340 are meant to illustrate example computing devices. Other computing devices, including other types of servers, may be used.

In one exemplary implementation, the data storage device 100 of FIGS. 1 and 2 may be sized to fit within a drive bay 335 of the server 330 of the drive bay 345 of the server 340 to provide data storage functionality for the servers 330 and 340. For instance, the data storage device 100 may be sized to a 3.5" disk drive form factor to fit in the drive bays 335 and 345. The data storage device 100 also may be configured to other sizes. The data storage device 100 may operably connect and communicate with the servers 330 and 340 using the interface 108. In this manner, the host may communicate commands to the controller board 102 using the interface 108 and the controller 110 may execute the commands using the flash memory chips 118a and 118b on the memory boards 104a and 104b.

Referring back to FIG. 1, the interface 108 may include a high speed interface between the controller 110 and the host 106. The high speed interface may enable for fast transfers of data between the host 106 and the flash memory chips 118a and 118b. In one exemplary implementation, the high speed interface may include a PCIe interface. For instance, the PCIe interface may be a PCIe x4 interface or a PCIe x8 interface. The PCIe interface 108 may include a PCIe connector cable assembly to the host 106. Other high speed interfaces, connectors and connector assemblies also may be used.

In one exemplary implementation, the communication between the controller board 102 and the flash memory chips 118a and 118b on the memory boards 104a and 104b may be arranged and configured into multiple channels 112. Each of the channels 112 may communicate with one or more flash memory chips 118a and 118b. The controller 110 may be configured such that commands received from the host 106 may be executed by the controller 110 using each of the channels 112 simultaneously or at least substantially simultaneously. In this manner, multiple commands may be executed simultaneously on different channels 112, which may improve throughput of the data storage device 100.

In the example of FIG. 1, twenty (20) channels 112 are illustrated. The completely solid lines illustrate the ten (10) channels between the controller 110 and the flash memory chips 118a on the memory board 104a. The mixed solid and dashed lines illustrate the ten (10) channels between the controller 110 and the flash memory chips 118b on the memory board 104b. As illustrated in FIG. 1, each of the channels 112 may support multiple flash memory chips. For instance, each of the channels 112 may support up to 32 flash memory chips. In one exemplary implementation, each of the 20 channels may be configured to support and communicate with 6 flash memory chips. In this example, each of the memory boards 104a and 104b would include 60 flash memory chips each. Depending on the type and the number of the flash memory chips 118a and 118b, the data storage 100 device may be configured to store up to and including multiple terabytes of data.

The controller 110 may include a microcontroller, a FPGA controller, other types of controllers, or combinations of these controllers. In one exemplary implementation, the controller 110 is a microcontroller. The microcontroller may be implemented in hardware, software, or a combination of hardware and software. For example, the microcontroller may be loaded with a computer program product from memory (e.g., memory module 116) including instructions that, when executed, may cause the microcontroller to perform in a certain manner. The microcontroller may be configured to receive commands from the host 106 using the interface 108 and to execute the commands. For instance, the commands may include commands to read, write, copy and erase blocks of data using the flash memory chips 118a and 118b, as well as other commands.

In another exemplary implementation, the controller 110 is a FPGA controller. The FPGA controller may be implemented in hardware, software, or a combination of hardware and software. For example, the FPGA controller may be loaded with firmware from memory (e.g., memory module 116) including instructions that, when executed, may cause the FPGA controller to perform in a certain manner. The FPGA controller may be configured to receive commands from the host 106 using the interface 108 and to execute the commands. For instance, the commands may include commands to read, write, copy and erase blocks of data using the flash memory chips 118a and 118b, as well as other commands.

In one exemplary implementation, the FPGA controller may support multiple interfaces 108 with the host 106. For instance, the FPGA controller may be configured to support multiple PCIe x4 or PCIe x8 interfaces with the host 106.

The memory module 116 may be configured to store data, which may be loaded to the controller 110. For instance, the memory module 116 may be configured to store one or more images for the FPGA controller, where the images include firmware for use by the FPGA controller. The memory module 116 may interface with the host 106 to communicate with the host 106. The memory module 116 may interface directly with the host 106 and/or may interface indirectly with the host 106 through the controller 110. For example, the host 106 may communicate one or more images of firmware to the memory module 116 for storage. In one exemplary implementation, the memory module 116 includes an electrically erasable programmable read-only memory (EEPROM). The memory module 116 also may include other types of memory modules.

The power module 114 may be configured to receive power (Vin), to perform any conversions of the received power and to output an output power (Vout). The power module 114 may receive power (Vin) from the host 106 or from another source. The power module 114 may provide power (Vout) to the controller board 102 and the components on the controller board 102, including the controller 110. The power module 114 also may provide power (Vout) to the memory boards 104a and 104b and the components on the memory boards 104a and 104b, including the flash memory chips 118a and 118b.

In one exemplary implementation, the power module 114 may include one or more direct current (DC) to DC converters. The DC to DC converters may be configured to receive a power in (Vin) and to convert the power to one or more different voltage levels (Vout). For example, the power module 114 may be configured to receive +12 V (Vin) and to convert the power to 3.3 v, 1.2 v, or 1.8 v and to supply the power out (Vout) to the controller board 102 and to the memory boards 104a and 104b.

The memory boards 104a and 104b may be configured to handle different types of flash memory chips 118a and 118b. In one exemplary implementation, the flash memory chips 118a and the flash memory chips 118b may be the same type of flash memory chips including requiring the same voltage from the power module 114 and being from the same flash memory chip vendor. The terms vendor and manufacturer are used interchangeably throughout this document.

In another exemplary implementation, the flash memory chips 118a on the memory board 104a may be a different type of flash memory chip from the flash memory chips 118b on the memory board 104b. For example, the memory board 104a may include SLC NAND flash memory chips and the memory board 104b may include MLC NAND flash memory chips. In another example, the memory board 104a may include flash memory chips from one flash memory chip manufacturer and the memory board 104b may include flash memory chips from a different flash memory chip manufacturer. The flexibility to have all the same type of flash memory chips or to have different types of flash memory chips enables the data storage device 100 to be tailored to different applications being used by the host 106.

In another exemplary implementation, the memory boards 104a and 104b may include different types of flash memory chips on the same memory board. For example, the memory board 104a may include both SLC NAND chips and MLC NAND chips on the same PCB. Similarly, the memory board 104b may include both SLC NAND chips and MLC NAND chips. In this manner, the data storage device 100 may be advantageously tailored to meet the specifications of the host 106.

In another exemplary implementation, the memory board 104a and 104b may include other types of memory devices, including non-flash memory chips. For instance, the memory boards 104a and 104b may include random access memory (RAM) such as, for instance, dynamic RAM (DRAM) and static RAM (SRAM) as well as other types of RAM and other types of memory devices. In one exemplary implementation, the both of the memory boards 104a and 104b may include RAM. In another exemplary implementation, one of the memory boards may include RAM and the other memory board may include flash memory chips. Also, one of the memory boards may include both RAM and flash memory chips.

The memory modules 120a and 120b on the memory boards 104a and 104b may be used to store information related to the flash memory chips 118a and 118b, respectively. In one exemplary implementation, the memory modules 120a and 120b may store device characteristics of the flash memory chips. The device characteristics may include whether the chips are SLC chips or MLC chips, whether the chips are NAND or NOR chips, a number of chip selects, a number of blocks, a number of pages per block, a number of bytes per page and a speed of the chips.

In one exemplary implementation, the memory modules 120a and 120b may include serial EEPROMs. The EEPROMs may store the device characteristics. The device characteristics may be compiled once for any given type of flash memory chip and the appropriate EEPROM image may be generated with the device characteristics. When the memory boards 104a and 104b are operably connected to the controller board 102, then the device characteristics may be read from the EEPROMs such that the controller 110 may automatically recognize the types of flash memory chips 118a and 118b that the controller 110 is controlling. Additionally, the device characteristics may be used to configure the controller 110 to the appropriate parameters for the specific type or types of flash memory chips 118a and 118b.

Figure 4:
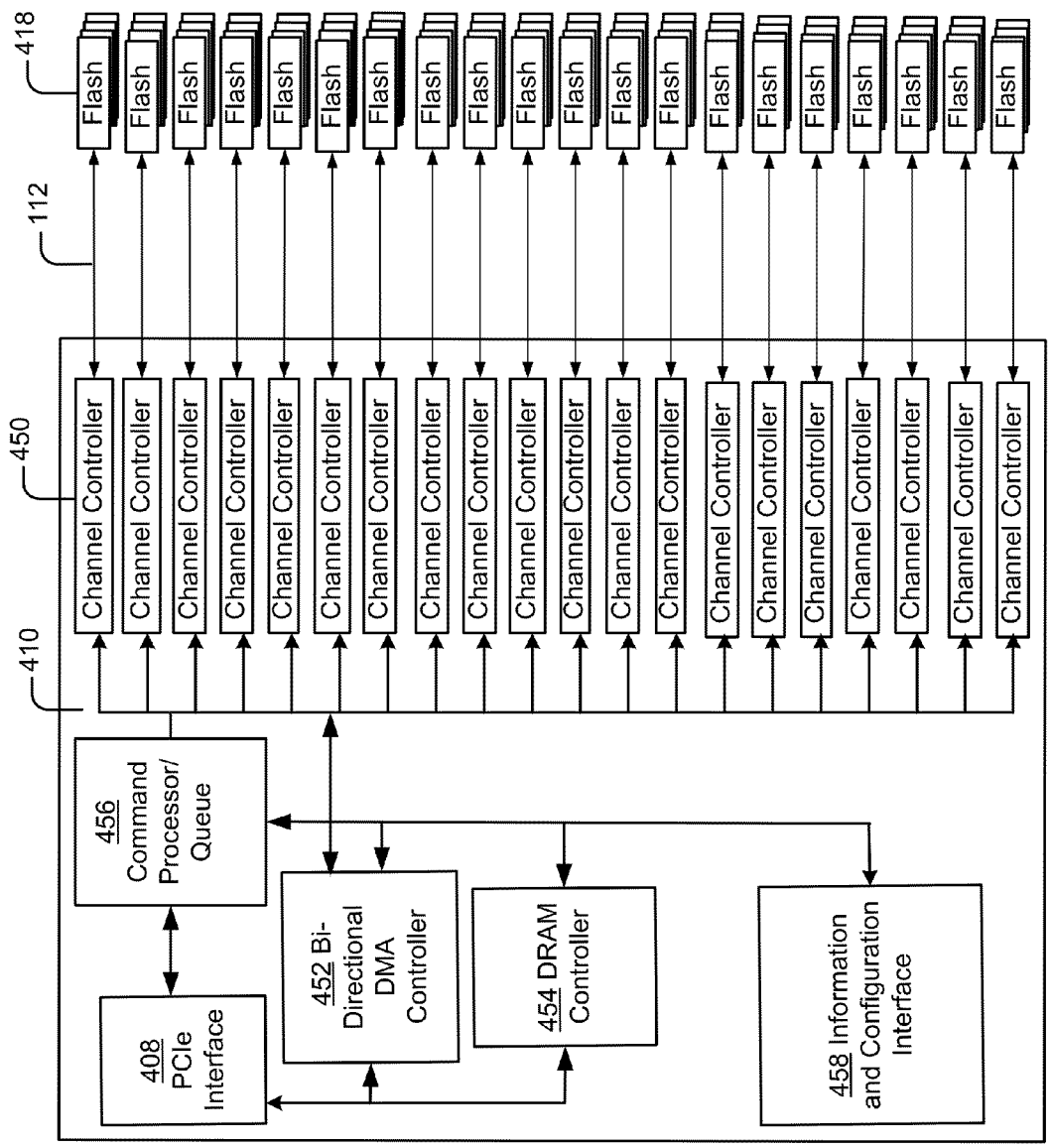
FIG. 4 is an exemplary block diagram of a controller.

As discussed above, the controller 110 may include a FPGA controller. Referring to FIG. 4, an exemplary block diagram of a FPGA controller 410 is illustrated. The FPGA controller may be configured to operate in the manner described above with respect to controller 110 of FIG. 1. The FPGA controller 410 may include multiple channel controllers 450 to connect the multiple channels 112 to the flash memory chips 418. The flash memory chips 418 are illustrated as multiple flash memory chips that connect to each of the channel controllers 450. The flash memory chips 418 are representative of the flash memory chips 118a and 118b of FIG. 1, which are on the separate memory boards 104a and 104b of FIG. 1. While illustrated in FIG. 4 as flash memory chips, the memory devices 418 may be other types of memory devices, as discussed above. The separate memory boards are not shown in the example of FIG. 4. The FPGA controller 410 may include a PCIe interface module 408, a bi-directional direct memory access (DMA) controller 452, a dynamic random access memory (DRAM) controller 454, a command processor/queue 456 and an information and configuration interface module 458.

Information may be communicated with a host (e.g., host 106 of FIG. 1) using an interface. In this example, FIG. 4, the FPGA controller 410 includes a PCIe interface to communicate with the host and a PCIe interface module 408. The PCIe interface module 408 may be arranged and configured to receive commands from the host and to send commands to the host. The PCIe interface module 408 may provide data flow control between the host and the data storage device. The PCIe interface module 408 may enable high speed transfers of data between the host and the controller 410 and ultimately the flash memory chips 418. In one exemplary implementation, the PCIe interface and the PCIe interface module 408 may include a 64-bit bus.

The bi-directional DMA controller 452 may be configured to interface with the PCIe interface 408, the command processor/queue 456 and each of the channel controllers 450. The bi-directional DMA controller 452 enables bi-directional direct memory access between the host and the flash memory chips 418.

The DRAM controller 454 may be arranged and configured to control the translation of logical to physical addresses. For example, the DRAM controller 454 may assist the command processor/queue 456 with the translation of the logical addresses used by the host and the actual physical addresses in the flash memory chips 418 related to data being written to or read from the flash memory chips 418. A logical address received from the host may be translated to a physical address for a location in one of the flash memory chips 418. Similarly, a physical address for a location in one of the flash memory chips 418 may be translated to a logical address and communicated to the host.

The command processor/queue 456 may be arranged and configured to receive the commands from the host through the PCIe interface module 408 and to control the execution of the commands through the channel controllers 450. The command processor/queue 456 may maintain a queue for a number of commands to be executed. In this manner, multiple commands may be executed simultaneously and each of the channels 112 may be used simultaneously or at least substantially simultaneously.

The command processor/queue 456 may be configured to process commands for different channels 112 out of order and preserve per-channel command ordering. For instance, commands that are received from the host and that are designated for different channels may be processed out of order by the command processor/queue 456. In this manner, the channels may be kept busy. Commands that are received from the host for processing on the same channel may be processed in the order that the commands were received from the host by the command processor/queue 456. In one exemplary implementation, the command processor/queue 456 may be configured to maintain a list of commands received from the host in an oldest-first sorted list to ensure timely execution of the commands.

The channel controllers 450 may be arranged and configured to process commands from the command processor/queue 456. Each of the channel controllers 450 may be configured to process commands for multiple flash memory chips 418. In one exemplary implementation, each of the channel controllers 450 may be configured to process commands for up to and including 32 flash memory chips 418.

The channel controllers 450 may be configured to process the commands from the command processor/queue 456 in order as designated by the command processor/queue 456. Examples of the commands that may be processed include, but are not limited to, reading a flash page, programming a flash page, copying a flash page, erasing a flash block, reading a flash block's metadata, mapping a flash memory chip's bad blocks, and resetting a flash memory chip.

The information and configuration interface module 458 may be arranged and configured to interface with a memory module (e.g., memory module 116 of FIG. 1) to receive configuration information for the FPGA controller 410. For example, the information and configuration interface module 458 may receive one or more images from the memory module to provide firmware to the FPGA controller 410. Modifications to the images and to the firmware may be provided by the host to the controller 410 through the information and configuration interface module 458. Modifications received through the information and configuration interface module 458 may be applied to any of the components of the controller 410 including, for example, the PCIe interface module 408, the bi-directional DMA controller 452, the DRAM controller 454, the command processor/queue 456 and the channel controllers 450. The information and configuration interface module 458 may include one or more registers, which may be modified as necessary by instructions from the host.

The FPGA controller 410 may be arranged and configured to cooperate and process commands in conjunction with the host. The FPGA controller 410 may perform or at least assist in performing error correction, bad block management, logical to physical mapping, garbage collection, wear levelling, partitioning and low level formatting related to the flash memory chips 418.

Figure 5:
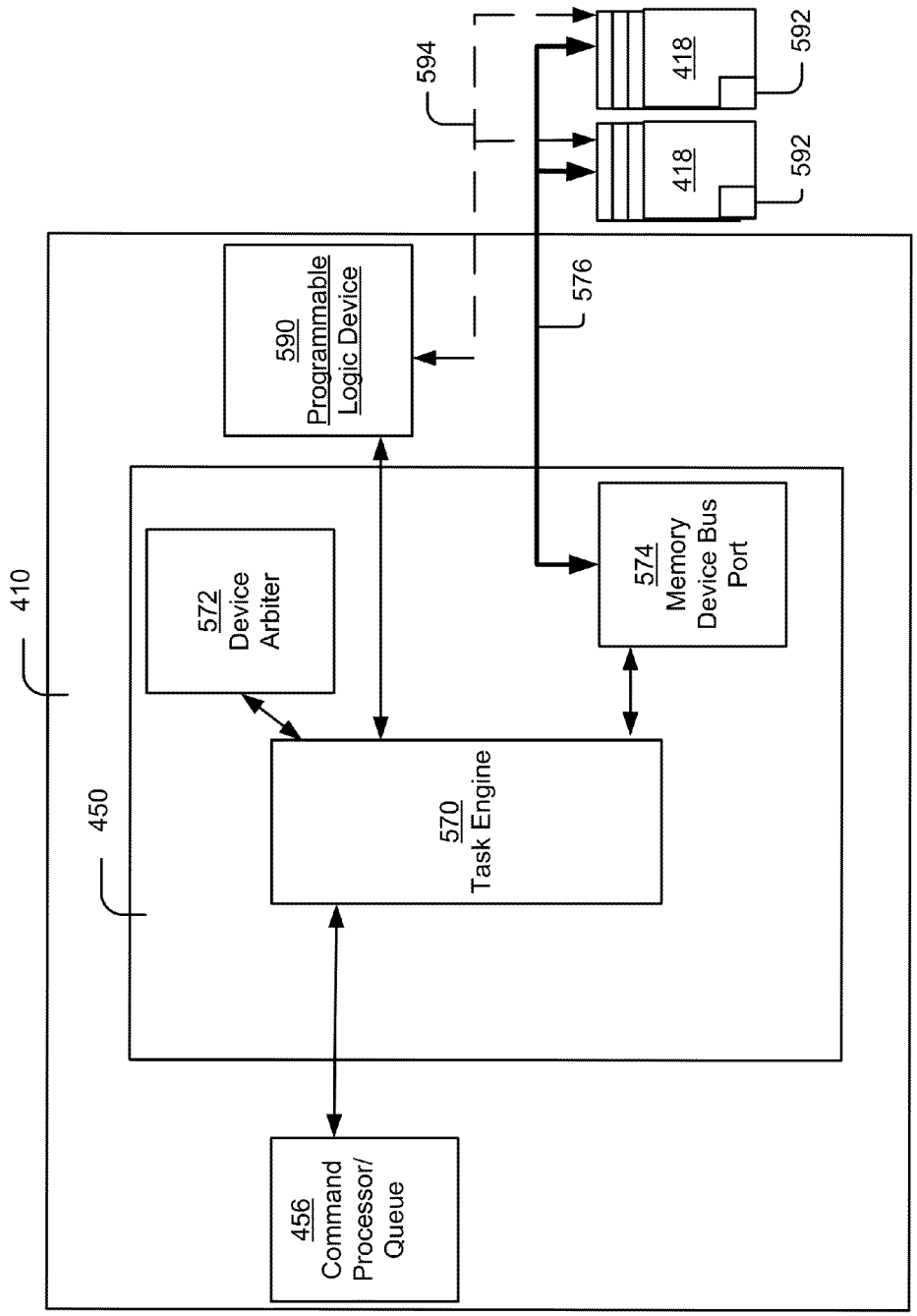
FIG. 5 is an exemplary block diagram of components related to a channel controller.

Referring to FIG. 5, an exemplary block diagram illustrates components related to one of the channel controllers 450. Although FIG. 5 illustrates a single channel controller 450, it is to be understood that each of the multiple channel controllers illustrated in FIG. 4 include the same components and connections. As discussed above, the channel controller 450 may be configured to control the operation of the memory devices 418. As illustrated in FIG. 5, the devices 418 are referred to as memory devices since they may be different types of memory devices including, for example, flash memory chips, DRAM chips, PCM chips and other types of memory chips. The channel controller 450 may be configured to control multiple memory devices. The channel controller 450 is a component on the controller board 410 and is operably coupled to command processor/queue 456. The channel controller 450 may be configured to receive commands from the command processor/queue 456 and to control the processing of the received commands by its associated memory devices 418. The channel controller 450 also may communicate to the command processor/queue 456 when commands have been processed by the memory devices 418.

In one exemplary implementation, the memory devices 418 may include flash memory chips, as discussed above. The channel controller 450 may be configured to process commands for performance by the flash memory chips including, for example, reading a flash page, programming a flash page, copying a flash page, erasing a flash page, reading a flash block's meta data, mapping a flash device's bad blocks and resetting a flash chip.

The channel controller 450 may include a task engine 570, a device arbiter 572, and a memory device bus port 574. The channel controller 450 may be operably coupled to the memory devices 418 using a command bus 576. The task engine 570 may be configured to enable multiple, simultaneous operations on the channel controlled by the channel controller 450. The task engine 570 enables high performance interleaving of commands to be executed by the multiple memory devices 418 associated with the channel.

In one exemplary implementation, the task engine 570 may include multiple task engines, where each of the task engines is an independent state machine that is configured to arbitrate the use of multiple shared resources. The task engine 570 may be configured to perform multi-threading of tasks using the shared resources. For example, one instance of the task engine 570 may perform an operation with one of the memory devices 418 and, at the same time, another instance of the task engine 570 may perform an operation to arbitrate the command bus 576 in conjunction with the device arbiter 572. The task engine 570 may be operably coupled to the command/queue processor 456 to coordinate the processing of commands received from the command processor/queue 456 using the memory devices 418.

The device arbiter 572 may be configured to assist the task engine 570 with the arbitrating the use of the memory devices 418. The task engine 570 may communicate with the memory devices 418 through the memory device bus port 574. The memory device bus port 574 may be configured to provide a physical interface between the channel controller 450 and the memory devices 418. As discussed above, the memory devices 418 may be on a memory board, which is separate from the controller board 410. The memory device bus port 574 may provide a physical interface between the controller board 410 and the memory board on which the memory devices 418 may be affixed.

The memory device bus port 574 may be operably coupled with the memory devices 418 using the command bus 576. The command bus 576 is operably coupled to each of the memory devices 418 that are associated with a particular channel controller 450. The commands received from the command processor/queue 456 that are designated for a particular memory device are processed using the command bus 576.

In general, a memory device is available to process a command when the memory device is in a ready state. The memory device is not available to process a command when the memory device is in a busy state. In one exemplary implementation, each of the memory devices 418 may use a signal to indicate when the memory device is ready and available to process a command and when the memory device is busy and not available to process a command. For example, each of the memory devices 418 may be configured to assert and de-assert a ready/busy signal to indicate if the memory device is available or if the memory device is busy. Each of the memory devices 418 may include a pin 592 on which the signal is asserted or de-asserted. When the memory device is processing a command, the ready/busy signal may be asserted. When the memory device is not processing a command, the ready/busy signal may be de-asserted. In another exemplary implementation, the ready/busy signal may be asserted when the memory device is available and the ready/busy signal may not be asserted when the memory device is not available.

In one exemplary implementation, the memory devices 418 may indicate a ready signal as a logic high on the pin 592 and the memory devices 418 may indicate a busy signal as a logic low on the pin 592. In another exemplary implementation, the memory devices 418 may indicate the ready signal as a logic low on the pin 592 and the busy signal as a logic high on the pin 592.

Each of the memory devices 418 may be operably coupled to a status bus 594. The pin 592 may be used to couple the memory device to the status bus 594. The status bus 594 may be configured to couple the memory devices 418 on a memory board to a programmable logic device (PLD) 590 on the controller board 410. The status bus 594 may be used to communicate the status of the memory devices 418 to the channel controller 450 without using the command bus 576.

In one exemplary implementation, the PLD 590 may be a complex programmable logic device (CPLD). The PLD 590 may be programmed with executable code or instructions that cause the PLD 590 to perform in a specific manner. The PLD 590 may be configured to retrieve a ready/busy signal from each of the memory devices 418 and to serialize the ready/busy signals. In this manner, the PLD 590 may aggregate multiple ready/busy signals from multiple different memory devices 418 and provide the aggregated signals in a serialized form to the channel controller 450. The PLD 590 may be a component on the controller board 410 just as the channel controller 450 is a component on the controller board 410. In other exemplary implementations, the PLD 590 may be a component of the channel controller 450.

The PLD 590 may sample the ready/busy signals over the status bus 594 by checking the status of each pin 592 at a sample rate. For example, the sample rate may be at 125 MHz. Other sample rates may be used. In this manner, the PLD 590 is continuously sampling the status of each of the memory devices 418 and providing the status in a serialized format to the channel controller 450.

The PLD 590 may communicate the serialized ready/busy signals to the task engine 570. The PLD 590 may be configured to have its own unique path to the channel controller 450 and specifically to the task engine 570. In this manner, the memory devices 418 do not need to be polled by the channel controller 450 to determine the status of the memory devices 418. By serializing the ready/busy signals and using the status bus 594, the command bus 576 does not need to be used and bandwidth on the command bus 576 does not need to be used to poll the status of the memory devices 418. In this manner, the command bus 576 does not need to be locked to determine the status of the memory devices 418.

The task engine 570 may be configured to de-serialize the ready/busy signals into a single bit per memory device. The de-serialized ready/busy signal enables the channel controller 450 to know the status of each of the memory devices 418 that are associated with that particular channel controller.

The data storage device may include multiple PLDs 590. In one exemplary implementation, one PLD 590 may be used for multiple channel controllers 450. For instance, a single PLD 590 may be used for every two channel controllers 450. In this implementation, the single PLD 590 may aggregate the ready/busy signals for all of the memory devices controlled by the two channel controllers. The PLD is configured to have its own unique path to each of the channel controllers.

Figure 6:
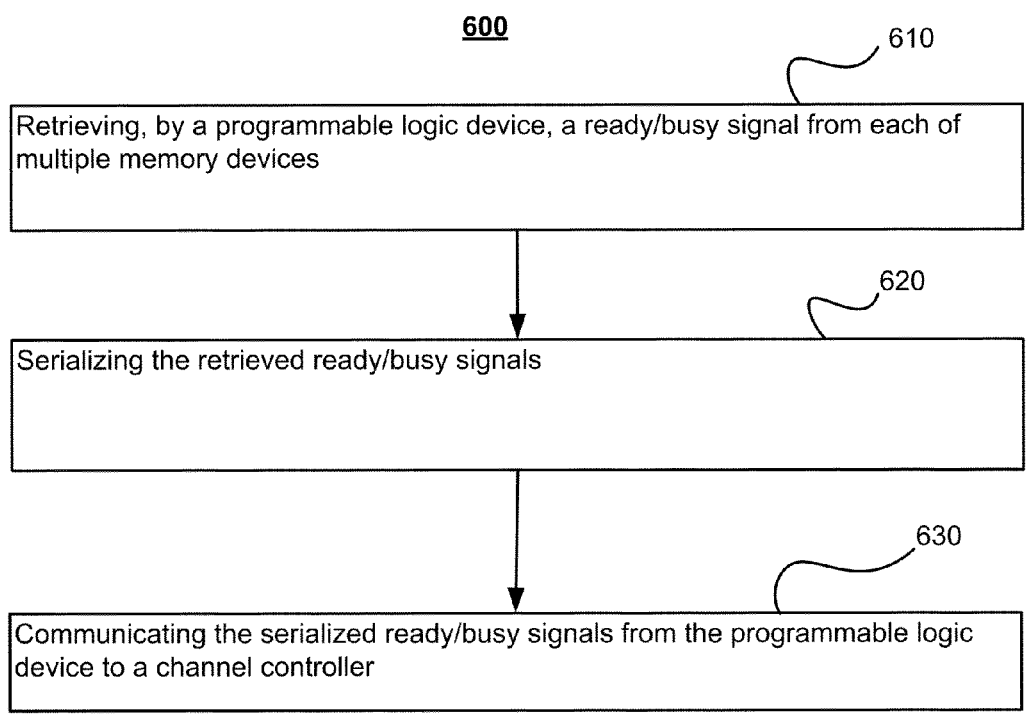
FIG. 6 is an exemplary flowchart illustrating example operations of the data storage device of FIG. 5.

Referring to FIG. 6, a process 600 is illustrated for determining a status of the memory devices. Process 600 may include retrieving, by a programmable logic device, a ready/busy signal from each of multiple memory devices (610), serializing the retrieved ready/busy signals (620) and communicating the serialized ready/busy signals from the programmable logic device to a channel controller (630).

For example, the PLD 590 of FIG. 5 may be configured to retrieve a ready/busy signal from each of the memory devices 418 (610). As discussed above, the PLD 590 may sample the pins 592 from each of the memory devices 418 to obtain the status of the memory devices 418. The PLD 590 may be configured to serialize the ready/busy signals (620) and then communicate the serialized ready/busy signals to a channel controller (630). The PLD 590 may use the status bus 594 to retrieve the ready/busy signals from the memory devices 418 instead of using the command bus 576. In this manner, the channel controller 450 does not need to poll the status of the memory devices 418 using the command bus 576.

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g., in a machine-readable storage device, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., a FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A data storage device comprising:
   a command bus;
   a status bus;
   multiple memory devices that are operably coupled to the command bus and to the status bus;
   a controller comprising multiple channel controllers, wherein the channel controllers are operably coupled to the command bus and to the status bus and each of the channel controllers is arranged and configured to control one or more of the memory devices; and
   multiple programmable logic devices that are operably coupled to the status bus, wherein each of the programmable logic devices is configured to:
      retrieve a ready/busy signal from each of the memory devices under control of one of the channel controllers using the status bus;
      serialize the ready/busy signals; and
      communicate the serialized ready/busy signals to the channel controllers.

2. The data storage device of claim 1 wherein the memory devices comprise flash memory chips.

3. The data storage device of claim 1 wherein the memory devices comprise dynamic random access memory (DRAM) chips.

4. The data storage device of claim 1 wherein the each of the channel controllers is configured to de-serialize the read/busy signals received from the programmable logic devices controlled by the channel controller.

5. The data storage device of claim 1 wherein each of the channel controllers receives a status of the controlled memory devices without polling the status of the controlled memory devices over the command bus.

6. The data storage device of claim 1 the status bus comprises an out-of-band bus that is configured to facilitate communication of a status of the memory devices to the channel controllers.

7. The data storage device of claim 1 further comprising:
   a memory board, wherein the memory devices are affixed to the memory board; and
   a controller board that is separate from the memory board and that is operably connected to the memory board, wherein the controller is affixed to the controller board.

8. The data storage device of claim 7 wherein the programmable logic devices are affixed to the memory board.

9. A method for determining a status of multiple memory devices, the method comprising:
   retrieving, by a programmable logic device, a ready/busy signal from each of multiple memory devices;
   serializing the retrieved ready/busy signals; and
   communicating the serialized ready/busy signals from the programmable logic device to a channel controller.

10. The method as in claim 9 wherein the multiple memory devices comprise flash memory chips.

11. The method as in claim 9 wherein the multiple memory devices comprise dynamic random access memory (DRAM) chips.

12. The method as in claim 9 wherein retrieving the ready/busy signal comprises retrieving the ready/busy signal from each of the memory devices using an out-of-band status bus.

13. The method as in claim 9 wherein:
   retrieving, by the programmable logic device, comprises retrieving, by the programmable logic device, a ready/busy signal from each of a first group of memory devices controlled by a first channel controller and retrieving, by the programmable logic device, a ready/busy signal from each of a second group of memory devices controlled by a second channel controller;
   serializing the retrieved ready/busy signals comprises serializing the retrieved ready/busy signals from the first group of memory devices and the second group of memory devices; and
   communicating the serialized ready/busy signals comprises communicating the serialized ready/busy signals from the programmable logic device to the first channel controller and the second channel controller.

14. A programmable logic device having instructions stored thereon, wherein the instructions, when executed, cause the programmable logic device to:
   retrieve a ready/busy signal from each of multiple memory devices;
   serialize the retrieved ready/busy signals; and
   communicate the serialized ready/busy signals to a channel controller.

15. The programmable logic device of claim 14 wherein the memory devices comprise flash memory chips.

16. The programmable logic device of claim 14 wherein the memory devices comprise dynamic random access memory (DRAM) chips.

17. The programmable logic device of claim 14 wherein the instructions that, when executed, cause the programmable logic device to retrieve the ready/busy signal comprise instructions that, when executed, cause the programmable logic device to retrieve the ready/busy signal from each of the memory devices using an out-of-band status bus.

18. The programmable logic device of claim 14 wherein the programmable logic device is on a memory board and the channel controller is on a separate controller board.

19. The programmable logic device of claim 14 wherein the instructions that, when executed, cause the programmable logic device to communicate the serialized ready/busy signals comprise instructions that, when executed, cause the programmable logic device to communicate the serialized ready/busy signals to the channel controller without being polled by the channel controller.

* * * * *

UNITED STATES PATENT AND TRADEMARK OFFICE
CERTIFICATE OF CORRECTION

| | | |
|---|---|---|
| PATENT NO. | : 8,433,845 B2 | Page 1 of 1 |
| APPLICATION NO. | : 12/756009 | |
| DATED | : April 30, 2013 | |
| INVENTOR(S) | : Albert T. Borchers et al. | |

It is certified that error appears in the above-identified patent and that said Letters Patent is hereby corrected as shown below:

In the Claims:

In column 15, line 26, in claim 4, after "wherein" delete "the".

In column 15, line 34, in claim 6, after "claim 1" insert --wherein--.

Signed and Sealed this
Twenty-seventh Day of May, 2014

Michelle K. Lee
*Deputy Director of the United States Patent and Trademark Office*